United States Patent [19]

Milkovic

[11] 3,976,941
[45] Aug. 24, 1976

[54] AUTO-RANGING SYSTEM FOR AN ELECTRONIC ENERGY METER

[75] Inventor: Miran Milkovic, Scotia, N.Y.

[73] Assignee: General Electric Company, Schenectady, N.Y.

[22] Filed: Sept. 13, 1974

[21] Appl. No.: 505,721

[52] U.S. Cl. .............................. 324/142; 324/140 R; 328/160; 328/173; 328/175; 330/51; 330/86
[51] Int. Cl.² ...................... G01R 7/00; G01R 11/32; G01R 7/12
[58] Field of Search .............. 324/140, 142; 330/51, 330/86; 328/160, 173, 175

[56] References Cited
UNITED STATES PATENTS

| | | | |
|---|---|---|---|
| 3,140,408 | 7/1964 | May | 330/51 |
| 3,346,697 | 10/1967 | Kitsopoulos | 330/51 |
| 3,516,002 | 6/1970 | Hillis | 330/51 |
| 3,780,273 | 12/1973 | Turrell | 324/142 |

OTHER PUBLICATIONS

"An Electronic Wattmeter for Nonsinusoidal Low Power Factor Power Measurements," by Hamburg et al., Sept. 1971, vol. Mag.-7, No. 3, pp. 438–442, IEEE Transactions on Magnetics.

*Primary Examiner*—Saxfield Chatmon, Jr.
*Attorney, Agent, or Firm*—Vale P. Myles

[57] ABSTRACT

An auto-ranging system for an electronic watt-hour meter includes a current transformer for measuring the electrical current in at least one line of an electrical power consuming system. The measured current is converted to a voltage which is proportional to the measured current by means of a current/voltage converter. A means responsive to the output of the current transformer incrementally varies the gain of the current/voltage converter inversely as the level of the measured current reaches each of a plurality of successively increasing discrete current levels. The output of the current/voltage converter is multiplied by the line voltage which is detected by a potential transformer with the output of the multiplier being coupled to an analog-to-pulse rate converter. The analog-to-pulse rate converter generates a pulse train having a pulse rate which is proportional to the product signal at the output of the multiplier. A means responsive to the output of the current transformer incrementally varies the pulse rate of the pulse train as the measured current reaches each of the successive plurality of discrete current levels so that the pulse rate varying means compensates the variance of the gain of the current-to-voltage converter. Thus, a watt-hour meter is provided which has a substantially constant gain and an exceedingly large dynamic range.

10 Claims, 3 Drawing Figures

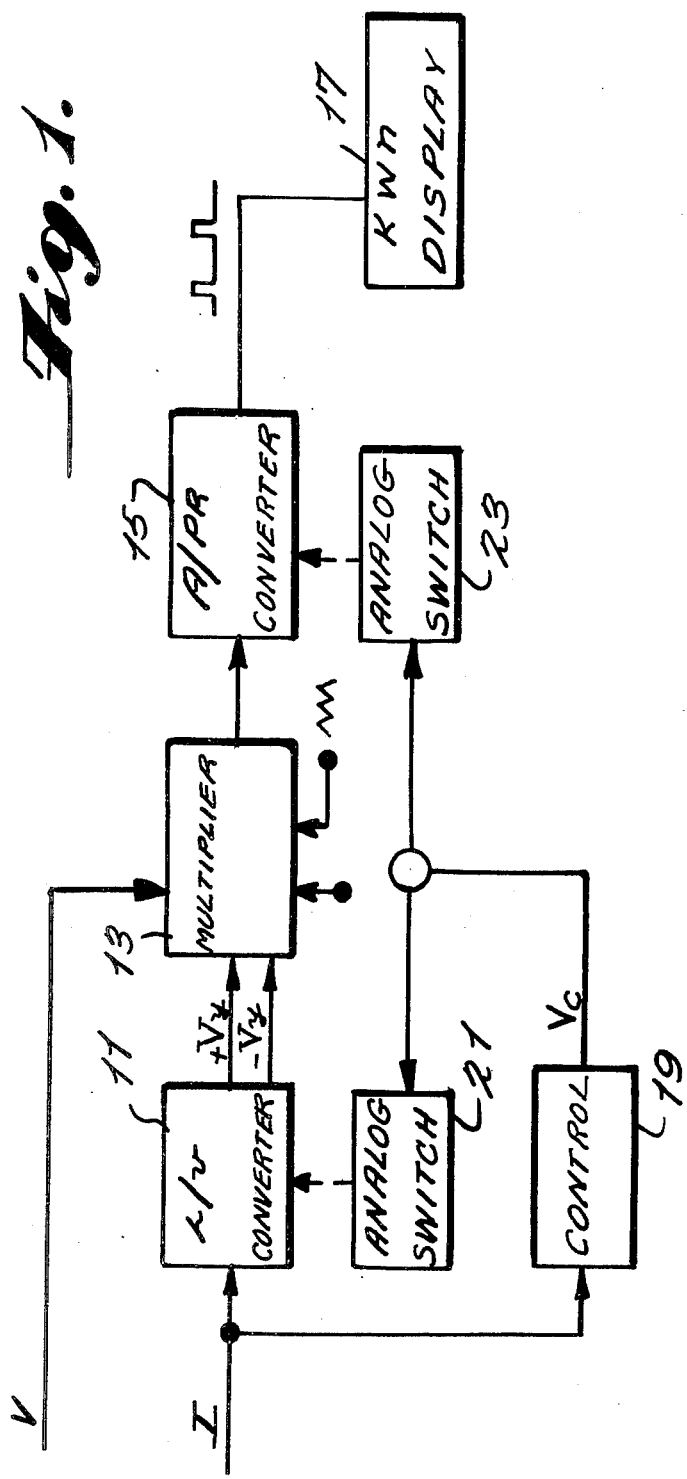
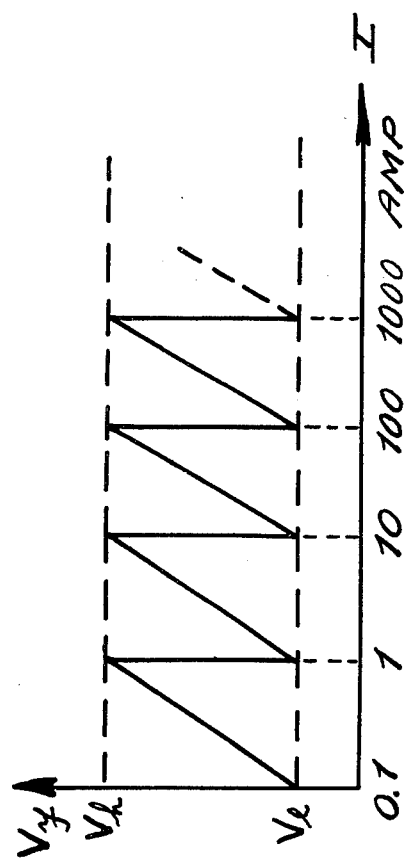

3,976,941

AUTO-RANGING SYSTEM FOR AN ELECTRONIC ENERGY METER

BACKGROUND OF THE INVENTION

This invention relates to an auto-ranging system for an electronic electrical energy meter.

In the past the metering of electrical energy, such as that flowing into homes, has been performed by electrical mechanical devices which are somewhat cumbersome because of the size thereof and in addition relatively expensive to maintain because of the moving mechanical parts thereof. More recently, as disclosed in the patent application of Miran Milkovic, Ser. No. 361,030, filed May 17, 1973 now U.S. Pat. No. 3,875,509, and in a second application of Miran Milkovic, Ser. No. 395,142, filed Sept. 7, 1973 now U.S. Pat. No. 3,875,508, solid state electronic meters are disclosed for measuring the flow of electrical energy in a power system. These applications disclose a method and apparatus for detecting the current flow through at least one line and the voltage of the line which parameters are appropriately multiplied and converted to a pulse train signal which is counted in a display mechanism to provide an indication of the electrical energy being consumed. These solid state electrical energy meters, however, have a critical drawback in that the dynamic range thereof is somewhat limited and the signal-to-offset or signal-to-noise ratio must be improved in order to provide a more accurate meter for measuring a wide range of power flow past a given point.

In the past, efforts have been made to improve the dynamic range and signal-to-noise ratio of solid state electrical energy meters as exemplified by the auto-ranging device proposed by Friedl and Seyfried in September 1972 in London at an IEE International Conference on Metering and Tariff. The device proposed by Friedl et al. utilizes two current transformers, one for supplying a voltage proportional to the current detected to a multiplier which multiplies the current proportional voltage by the voltage detected across the secondary of a potential transformer in the power system. The output of the multiplier is converted to a pulse train and is then coupled to an output display mechanism via a frequency divider. A second current transformer provides a current level signal to a range detector which in turn calibrates the level of the current proportional voltage so that as the current level increases past each of a plurality of discrete levels, the voltage which is proportional to the current decreases incrementally. In order to provide an overall system transfer function which is constant, that is, to maintain the ratio of pulses at the output of the system to the power input constant, the range detector coupled to the second transformer provides a signal for varying the frequency divider in discrete steps so that as the current input increases past each of the discrete levels, the dividing factor of the frequency divider decreases by a factor sufficient to maintain the transfer function of the solid state meter constant over a wide range. The Friedl et al. compensation device requires a second current transformer which increases the cost of the solid state electrical energy meter and in addition increases the cost of installing the meter in a locality. Further, a frequency divider is required which further adds to the expense of providing a relatively economical yet accurate metering system.

It therefore is an object of this invention to provide an accurate and reliable solid state electrical energy metering device having a wide dynamic range.

It is another object of this invention to provide an economical and reliable electrical energy meter having a relatively high signal-to-noise ratio and having a wide dynamic range.

SHORT STATEMENT OF THE INVENTION

Accordingly, this invention relates to an auto-ranging system for an electronic watt-hour meter which includes a current transformer for measuring electrical current in at least one line of an electrical power consuming system. The output of the current transformer is converted to a voltage which is proportional to the current. A means which is responsive to the output of the current transformer is provided for incrementally varying the value of the current proportional voltage inversely as the measured current reaches each of a plurality of successively increasing discrete current levels. The current proportional voltage is coupled to a multiplier as is the output of the secondary of a potential transformer which measures the voltage across the line. The multiplier provides a voltage signal at its output which is proportional to the product of the current proportional voltage and the output at the secondary of the potential transformer. This signal is converted to a pulse train having a frequency which is proportional to the amplitude of the output voltage of the multiplier. A circuit controlled in accordance with the current level sensed in the current transformer incrementally varies the pulse rate of the pulse train when the measured current reaches each of the plurality of discrete levels. The pulse rate varying circuit compensates for decreasing the current proportional voltage as the detected current reaches each of the plurality of discrete levels so that the ratio of pulses to detected power remains substantially constant over a wide dynamic range.

C-MOS circuitry is utilized so that a compact metering arrangement is provided while at the same time maintaining the expense of fabricating and installing the metering apparatus to a minimum.

BRIEF DESCRIPTION OF THE DRAWINGS

Other objects, features and advantages of the present invention will become more fully apparent from the following detailed disclosure of the preferred embodiment, the appended claims and the accompanying drawings, in which:

FIG. 1 is a schematic block diagram of the auto-ranging system for an electrical energy meter;

FIG. 2 is a graphical display of the voltage $V_y$ as the detected current flow increases.

DETAILED DESCRIPTION OF THE PREFERRED EMBODIMENT

Figure 3:
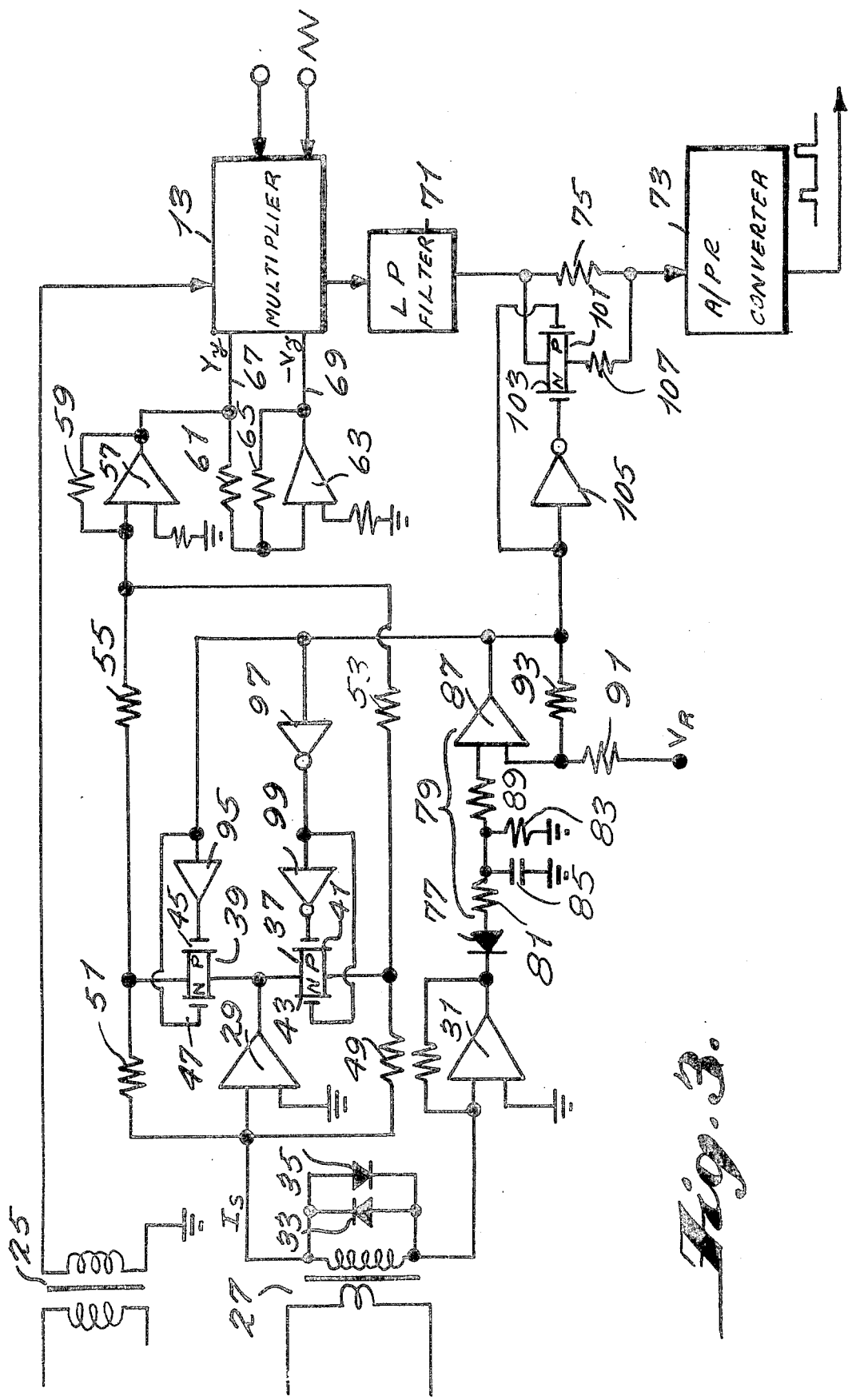
FIG. 3 is a detailed schematic diagram illustrating a practical embodiment of the auto-ranging system of FIG. 1.

Refer now to FIG. 1 where there is disclosed a schematic block diagram of the preferred embodiment of the auto-ranging system for an electrical energy meter of the present invention. Current flowing in a power utilization system is detected by a suitable means, such as, for example, a current transformer (not shown) of conventional design. The detected level of current is coupled to a current-to-voltage converter 11 which may take the form of a trans-resistance amplifier where the current signal is converted to a voltage having an amplitude which is proportional to the input current level. The output of the current-to-voltage converter, which is phase split to provide two signals 180° out of phase, is coupled to a multiplier 13 such as disclosed and claimed in the aforementioned U.S. patent applications of Milkovic Ser. No. 361,030 and Ser. No. 395,142 now U.S. Pat. Nos. 3,875,509 and 3,875,508, respectively. Also coupled to the multiplier is the voltage detected on the line through which the detected current flows. This voltage may be derived by any one of a number of suitable means such as, for example, a potential transformer of conventional design.

The multiplier 13 provides a pulse width amplitude modulated output signal having an average value which is proportional to the product of the detected voltage and the detected current flowing through the power system. This signal is converted in an analog-to-pulse rate converter 15 to a pulse train, the frequency of the pulse train being proportional to the amplitude of the product signal at the output of the multiplier 13. Thus, a pulse train is derived having a pulse frequency which is proportional to the power flowing through the power system. The pulse train is then coupled to a kilowatt hour display 17 which may take the form of a counter or other suitable digital display means. The pulse train is in effect integrated by the kilowatt hour display 17 to provide a visible output representing the integral of the power flowing in the system, i.e., the electrical energy flowing through the system. In the alternative, the display may include an output which can be coupled to an appropriate control system for controlling the amount of power flowing through the system.

In order to increase the signal-to-offset or signal-to-noise ratio and the dynamic range of the kilowatt-hour meter, a current level sensor 19 is provided which detects the current level at the output of the current transformer. The output of the current level sensor 19 is coupled to a pair of analog switches 21 and 23. Analog switch 21 controls the gain of the current-to-voltage converter 11 such that as the input current being detected reaches one of a predetermined plurality of successively increasing current levels, the analog switch decreases the gain of the current-to-voltage converter by a discrete quantity as can be best seen with reference to FIG. 2 of the drawings. In FIG. 2 of the drawings the abscissa represents the level of current detected and the ordinate represents the voltage $V_y$ at the output of the current-to-voltage converter 11. Initially, assume a threshold level of 0.1 ampere of current is flowing through the system and is detected by the current transformer. At this level of current flow, the current-to-voltage converter 11 is at its maximum gain level. Then, as the level of current increases to 1 ampere, for example, the analog switch 21 decreases the gain of the converter 11 by a preselected increment such that the output voltage thereof goes from $V_h$ to $V_1$. Then as the current increases in the system to 10 amperes, the analog switch 21 is again energized to decrease the gain of the converter 11 so that voltage output thereof goes from $V_h$ back to $V_1$ and so on in as many increments as is practically desirable. Thus, the input to the multiplier 13 always stays in a range of $V_1$ to $V_h$, thereby substantially reducing the internal dynamic range requirements of the multiplier while at the same time increasing substantially the dynamic range of the entire system.

The analog switch 23 controls the gain or the transfer function of the analog-to-pulse rate converter 15 such that as the current level detected reaches each of the discrete levels 1 ampere, 10 amperes, etc., the ratio of pulses at the output of the converter 15 to the voltage at the input increases in discrete steps to compensate for the decreased gain of the current-to-voltage converter 11. Thus, the number of pulses generated per second by the analog to pulse rate converter 15 per detected current flow through the electrical system remains a constant over a wide dynamic range.

Refer now to FIG. 3 where there is illustrated a more detailed schematic diagram of the auto-ranging system of the present invention. A potential transformer 25 detects the voltage on a given line in an electrical power consuming system (not shown). The secondary of the potential transformer 25 is connected directly to a multiplier 13 of the pulse width amplitude modulation type disclosed in applicant's prior U.S. Patent Applications Ser. No 361,030 and Ser. No. 395,142 now U.S. Pat. Nos. 3,875,509 and 3,875,508, respectively. However, it should be understood that the multiplier 13 can be of any conventional design known in the art and accordingly is not illustrated herein in detail in order to describe the important features of the present invention with greater clarity and conciseness.

A current transformer 27 detects the current flowing in the electrical power system with the secondary of the current transformer being coupled to operational amplifiers 29 and 31. The secondary of the current transformer 27 is protected and the current generated therein limited by means of parallel aligned diodes 33 and 35. These diodes limit the current level in the secondary in order to protect the operational amplifiers 29 and 31 as well as the secondary winding.

The output of amplifier 29 is coupled to a pair of C-MOS transmission pairs 37 and 39. Transmission pair 37 includes a P-channel MOS transistor 41 and an N-channel MOS transistor 43 having their source and drain terminals connected in common. Transmission pair 39 includes a P-channel transistor 45 and an N-channel transistor 47 also having their source and drain terminals connected in common. The source terminals of the transistors of the transmission pair 37 are connected in common via a feedback resistor 49 to the input of the operational amplifier 29 while the source terminals of the transmission pair 39 are connected in common to the input of the operational amplifier 29 via a second feedback resistor 51. In addition, the source terminals of each of these transmission pairs are connected through input resistors 53 and 55 to an operational amplifier 57. The gain of the operational amplifier 57 is determined by the ratio of the feedback resistance 59 thereacross to the respective input resistors 53 and 55. The output of the operational amplifier 57 is connected directly to one input of the multiplier 13 and via an input resistance 61 to the input of an inverting operational amplifier 63. The gain of the operational amplifier 63 is controlled by the ratio of the feedback resistor 65 to the input resistor 61. Thus, the operational amplifier 63 provides phase inversion or phase splitting so that the two signals $-V_y$ and $V_y$ being coupled to the multiplier 13 on lines 67 and 69, respectively, are of substantially the same amplitude but 180° out of phase. Also coupled to the multiplier 13 is standard reference voltage $V_R$ and a 10 kilohertz sawtooth waveform as illustrated. The output of the multiplier 13 is appropriately averaged and converted to a d.c. signal by a low pass filter 71 of conventional design. The output of the low pass filter is then coupled to an analog-to-pulse rate converter 73 via resistor 75. As aforementioned, the analog-to-pulse rate converter 73 provides at the output thereof a pulse train having a frequency which is directly proportional to the product of the signals at the output of the multiplier 13 and, if the voltage in the system is constant, provides a pulse train having a frequency which is directly proportional to the current $I_s$ in the secondary of the current transformer 27. The analog-to-pulse rate converter may be of a conventional design known in the art.

An operational amplifier 31 appropriately amplifies the current induced in the secondary of the current transformer 27 and inverts the polarity of this current signal. The output of the operational amplifier 31 is coupled through an isolation diode 77 to a hysteresis comparator generally designated by the numeral 79. The hysteresis comparator includes a low pass filter network including resistors 81 and 83 and a capacitor 85. The output of the filter is coupled to the inverting input of an operational amplifier 87 via input resistor 89. The other input terminal of the operational amplifier is connected via resistor 91 to a source of constant potential $V_R$. The operational amplifier 87 thus connected is in the form of a comparator which provides an output of selected polarity depending on whether the input thereto via resistor 89 exceeds a preset level. The output of the comparator 79 is coupled back to the input via a feedback resistor 93 and in addition is connected to the gate of N-channel transistor 47 and via an inverter 95 to the gate of P-channel transistor 45. The output of the comparator 79 is also connected via an inverter 97 to the gate of N-channel transistor 43 and via a second inverter 99 to the gate of P-channel transistor 41. Finally, the output of the comparator 79 is coupled directly to the base terminal of P-channel transistor 101 and to the gate of N-channel transistor 103 via inverter 105. The transistors 103 and 101 form a C-MOS transmission pair which transmission pair is connected in series with resistor 107 across resistor 75.

To understand the operation of the above-described circuit, it should be recalled that for P-channel enhancement mode operation, a source to drain conductive path exists for low gate voltages. Increasing the gate voltage reduces the conductivity and ultimately turns off the transistor when sufficient gate voltage is attained. Conversely for N-channel enhancement operation a conductive path does not exist for small gate voltages but rather is established when the gate voltage exceeds a minimum positive gating threshold. Further, for convenience of description, each of the transmission pairs will be referred to as being ON when both component transistors are conducting and OFF when both of the component transistors are non-conducting.

Initially assume that no power is flowing in the power conduction system and accordingly the secondary of the current transformer 27 has no current flow induced therein. Thus, the output of the operational amplifier 31 is low and accordingly, the inverting input to the operational amplifier 87 is low. Thus, the output of the operational amplifier 87 is a positive high voltage because of the input from the reference voltage $V_R$ to the non-inverting input of the operational amplifier. This high voltage is coupled to the base of N-channel transistor 47 to turn this transistor on. At the same time, the signal is inverted by inverter 95 and coupled to the base of P-channel transistor 45 to turn this transistor on. Accordingly, the output of the operational amplifier 29 is connected directly to the feedback resistor 51 and to the operational amplifier 57 via input resistor 55. At the same time, the high output of the operational amplifier 87 is inverted by inverter 97 and coupled to N-channel transistor 43 to turn this transistor off. The low output of inverter 97 is inverted by inverter 99 to provide a high output which, as is well known, turns off the P-channel enhancement mode transistor 41. Thus, the circuit connection between the output of the operational amplifier 29 and the feedback resistor 49 is in effect open circuited. Finally, the high output is coupled to N-channel transistor 103 via inverter 105 and is coupled directly to P-channel transistor 101. Accordingly, transistors 101 and 103 are turned off, thereby opening the circuit from the output of the low pass filter 71 to the analog-to-pulse rate converter 73 via resistor 107.

As the current flowing through the power system increases, the current $I_s$ in the secondary of the current transformer increases and accordingly the output of the operational amplifier 29 increases. This increased voltage is coupled via the transmission pair 39 and input resistor 55 to the operational amplifier 57. The output of the operational amplifier 57 is coupled directly to the multiplier 13 and is inverted via inverter 63 and coupled to the multiplier 13. At the same time the line voltage detected by the potential transformer 25 is coupled to the multiplier 13 which provides a product signal at the output thereof which corresponds to the product of the detected current and voltage in the power system. The output voltage is converted to a d.c. signal having an amplitude which corresponds to the average of the output of the multiplier 13 by a low pass filter 71 and this signal is coupled directly to the analog-to-pulse rate converter 73 via resistor 75. The analog-to-pulse rate converter 73 provides an output pulse train having a frequency which is directly proportional to the product of the current and voltage of the power system and in the case where the voltage of the system is constant, is directly proportional to the current flowing in the power system.

Now assume, for example, that the current level in the system goes above 1 ampere. In this case the output of the operational amplifier 31 is sufficient to switch the comparator 79 so that the transmission pair 39 is turned off and the transmission pair 37 is turned on. It should be observed at this point that the low pass filter of the comparator 79 which includes the resistors 81 and 83 and capacitor 85, is provided to prevent oscillation of the system about the 1 ampere level so that once comparator 79 is switched, it remains switched until the current drops below the 1 ampere level for a predetermined period of time or by a predetermined amount.

The output of the operational amplifier 29 is now connected to the amplifier 57 via input resistor 53 and is connected via feedback resistor 49 to its input terminal. At the same time, the connection of the output of the operational amplifier 29 to the feedback resistor 51 is opened because the transmission pair 39 is off. If, for example, resistor 51 is ten times as great as feedback resistor 49, then the voltage at the output of the operational amplifier 29 will drop, for example, from ten volts to one volt, depending, of course, upon the scale of voltages at the output of the operational amplifier 29. Hence, as illustrated in FIG. 2, the output of the operational amplifier is the same as when the current level detected is at a predetermined offset level such as, for example, 0.1 ampere.

The output of the operational amplifier 29 is now coupled to the multiplier 13 via amplifier 57 and inverter 63. The output of the multiplier 13 will accordingly be reduced by a factor of 10 as will the output of low pass filter 71. However, since ten times as much power is being consumed in the power system being measured as was consumed when only 0.1 ampere flowed therein, a compensating means must be provided to automatically account for the fact that the relatively small resistor 49 has been coupled to the feedback circuit of operational amplifier 29. This is achieved by coupling the low output of the comparator 79 to the gate terminal of P-channel transistor 101 and via inverter 105 to the gate terminal of N-channel transistor 103. Thus, the transmission pair formed by transistors 101 and 103 is turned on, thereby connecting resistor 107 in parallel with resistor 75.

In order to make the total gain of the system constant, that is, in order to make the ratio of output pulses per second to the power level being detected a constant, the following relationship must hold:

$$R_{51}/R_{49} = \frac{R_{75}}{R_{75}R_{107}/(R_{75} + R_{107})}$$

Thus, the parallel combination of resistor 75 and resistor 107 must be one-tenth the value of resistor 75 if the ratio of resistor 49 to resistor 51 is 1:10. Thus, it can be seen the attenuation of the signal being coupled between the low pass filter 71 and the analog-to-pulse rate converter 73 is in effect decreased by a factor of ten to thereby compensate for the fact that the gain of the operational amplifier 29 has been reduced by a factor of ten. Thus, the overall system gain or transfer function remains constant despite the fact that the gain of operational amplifier 29 is varied discretely as is the attenuation factor between the output of the low pass filter 21 and the analog-to-pulse rate converter 73.

It should be understood that while the circuitry for incrementally changing the gain of operational amplifier 29 and the attenuation at the input to the analog to pulse rate converter 73 is shown as providing only one incremental step in the embodiment of FIG. 3, it should be understood that as many incremental steps as is practically desired can be provided in keeping with the present invention by switch-further feedback resistors in and out of the feedback circuit of amplifier 29 and by adding further resistors in parallel with the resistor 75. Further, it can be seen that by using C-MOS circuitry, the metering system of the present invention, including the auto-ranging system, can be easily fabricated by integrated circuit techniques to provide a compact metering system utilizing very little external power.

While the present invention has been disclosed in connection with the preferred embodiment thereof, it should be understood that there may be other obvious variance of the present invention which fall within the spirit and scope of the invention as defined by the appended claims.

What is claimed is:

1. In an electronic watt-hour meter for measuring the power consumed in an electrical powering consuming system including means for measuring the current in said system, means for measuring the voltage across the load impedance of said system, means for multiplying said measured current by said measured voltage to derive a product signal proportional to the power consumed in said system and means for converting said product signal to a pulse train having a pulse rate which is proportional to said product signal, the improvement comprising:
   means responsive to said current measuring means for incrementally varying the value of said measured current inversely as said measured current reaches each of a plurality of discrete levels, and means responsive to said current measuring means for incrementally varying the pulse rate of said pulse train as said measured current reaches each of said plurality of discrete levels, said pulse rate varying means incrementally increasing the pulse rate as said measured current is incrementally decreased and vice versa, to thereby maintain the ratio of pulses generated to power measured constant.

2. The watt-hour meter of claim 1 wherein said means for incrementally varying the value of said measured current comprises means for converting said measured current to a voltage proportional to said measured current, and means for incrementally varying the gain of said current-to-voltage converting means inversely as said measured current reaches each of a plurality of discrete levels.

3. The watt-hour meter of claim 1 wherein said means for incrementally varying the value of said measured current comprises
   a variable gain amplifier,
   gating means for varying the gain of said amplifier incrementally, and
   means responsive to the level of said measured current for selectively switching said gating means to thereby incrementally vary the gain of said variable gain amplifier.

4. The watt-hour meter of claim 3 wherein said means responsive to said measured current for selectively energizing said gating means includes at least one hysteresis comparator, said comparator generating a gating signal when said measured current reaches a predetemined current level.

5. The watt-hour meter of claim 4 wherein said means responsive to said current measuring means for incrementally varying the pulse rate of said pulse train comprises:
   means for varying the output of said multiplying means incrementally, the output of said multiplier being incrementally increased when the gain of said variable gain amplifier is decreased and vice versa to thereby maintain the ratio of pulses generated to power measured constant.

6. The watt-hour meter of claim 5 wherein said means for incrementally varying the output of said multiplier comprises
   a plurality of resistors connected in parallel between said multiplying means and said means for converting said product signal to a pulse train,
   switching means in series with at least one of said resistors and means responsive to the output of said hysteresis comparator for selectively switching said switch when the current level measured reaches a predetermined discrete level to thereby vary the attenuation of the product signal before said signal is coupled to said product signal to pulse rate converter.

7. An auto-ranging system for an electronic watt-hour meter comprising
   means for measuring the current in an electrical energy consuming system,
   means for measuring the voltage across the load impedance of said system,
   means for multiplying said measured current by said measured voltage to derive a product signal proportional to the power consumed in said system,
   means responsive to said current measuring means for incrementally decreasing the value of said product signal by a discrete quantity as said measured current increases to each of a plurality of discrete levels,
   means for converting said product signal to a pulse train, said pulse train having a frequency proportion to the value of said product signal, and
   means responsive to said current measuring means for incrementally increasing the frequency of said pulse train each time said product signal is incrementally decreased to thereby maintain the transfer function of said auto-ranging system constant.

8. An auto-ranging system for an electronic watt-hour meter comprising
   means for measuring the current in an electrical energy consuming system,
   means for measuring the voltage across the load impedance of said system,
   means for converting said measured current to a voltage proportional to said current,
   means responsive to said current measuring means for incrementally varying the gain of said current-to-voltage converter by a discrete amount inversely as said measured current reaches each of a plurality of predetermined discrete levels,
   means response to said current proportional voltage and said measured voltage for deriving a product signal proportional to the product of said voltages,
   means for converting said product signal to a pulse train, said pulse train having a frequency proportional to the magnitude of said product signal, and
   means for incrementally varying the pulse rate of said pulse train as said measured current reaches each of said plurality of discrete levels, said means for varying the rate of said pulse train increasing the pulse rate as the gain of said current-to-voltage converter is decreased and decreasing the pulse rate as the gain of said current-to-voltage converter increases to thereby maintain the ratio of pulses generated to power measured constant.

9. The watt-hour meter of claim 4 wherein said means responsive to said current measuring means for incrementally varying the pulse rate of said pulse train comprises:
   means for varying the product signal generated by said multiplying means incrementally, said product signal being incrementally increased when the gain of said variable gain amplifier is decreased and vice versa to thereby maintain the ratio of pulses generated to power measured constant.

10. The watt-hour meter of claim 9 wherein said means for incrementally varying the product signal generated by said multiplying means comprises:
    a plurality of resistors connected in parallel to one another for coupling said product signal to said means for converting said product signal to a pulse train,
    switching means in series with at least one of said resistors, and
    means responsive to the output of said hysteresis comparator for selectively switching said switching means when the current level measured reaches a predetermined discrete level to thereby vary the attenuation of the product signal before said signal is coupled to said means for converting said product signal to a pulse train.

* * * * *